(12) United States Patent
Chao et al.

(10) Patent No.: US 8,154,879 B2
(45) Date of Patent: Apr. 10, 2012

(54) MOTHERBOARD

(75) Inventors: Chih-Hang Chao, Taipei Hsien (TW);
Yu-Hsu Lin, San Jose, CA (US);
Jeng-Da Wu, Taipei Hsien (TW)

(73) Assignee: Hon Hai Precision Industry Co., Ltd.,
Tu-Cheng, New Taipei (TW)

( * ) Notice: Subject to any disclaimer, the term of this patent is extended or adjusted under 35 U.S.C. 154(b) by 960 days.

(21) Appl. No.: 11/849,306

(22) Filed: Sep. 3, 2007

(65) Prior Publication Data

US 2009/0016024 A1    Jan. 15, 2009

(30) Foreign Application Priority Data

Jul. 12, 2007   (CN) .......................... 2007 1 0201059

(51) Int. Cl.
*H05K 7/02* (2006.01)
*H05K 7/06* (2006.01)
*H05K 7/08* (2006.01)
*H05K 7/10* (2006.01)

(52) U.S. Cl. ......... 361/760; 361/752; 361/807; 361/810

(58) Field of Classification Search .......... 361/719–721, 361/752–753, 807–810
See application file for complete search history.

(56) References Cited

U.S. PATENT DOCUMENTS

| | | | | |
|---|---|---|---|---|
| 6,906,923 | B2 * | 6/2005 | Lofland et al. | 361/704 |
| 7,142,427 | B2 * | 11/2006 | Reents | 361/704 |
| 7,170,165 | B2 * | 1/2007 | Berto et al. | 257/718 |
| 7,447,039 | B2 * | 11/2008 | Chao et al. | 361/748 |
| 7,492,598 | B2 * | 2/2009 | Narasimhan et al. | 361/719 |
| 2006/0152904 | A1 * | 7/2006 | Chuang | 361/703 |

FOREIGN PATENT DOCUMENTS

CN              100517173 C        7/2006
* cited by examiner

*Primary Examiner* — Tuan T Dinh
(74) *Attorney, Agent, or Firm* — Altis Law Group, Inc.

(57) ABSTRACT

A motherboard includes a printed circuit board, a first chip and a second chip arranged on the printed circuit board in parallel. A plurality of securing holes are defined in the printed circuit board around the first chip. At least one isolating hole is defined in the printed circuit board between the second chip and a first line determined by two of the securing holes close to the second chip. Should the printed circuit board suffer an impact, damage to the chips may be effectively minimized or prevented.

10 Claims, 4 Drawing Sheets

FIG. 1 <Related Art>

MOTHERBOARD

BACKGROUND

1. Field of the Invention

The present invention relates to motherboards for computers, particularly to a motherboard configured to prevent or minimize damage to a semiconductor chip on the motherboard when the motherboard suffers an impact.

2. Description of Related Art

In the design process of a motherboard, stability of chips on the motherboard is a prime concern. In manufacturing of a motherboard, semiconductor chips are usually mounted on a printed circuit board via tin balls. A conventional tin ball is made with lead. Because of good capability of lead for resisting shock, the tin ball is not easily damaged. However, due to the dangers of leaded tin balls polluting the environment and damaging health of people, nonleaded tin balls are now commonly used in the process of mounting a semiconductor chip to a printed circuit board. However, because of the poor capability of non-leaded tin balls to resist shock, they are easily damaged when the printed circuit board suffers an impact, thereby affecting performance of chips on the motherboard.

When non-leaded tin balls are applied in the conventional motherboard, aforesaid things usually happen. Referring to FIG. 1, a conventional motherboard is shown, which includes a PCB 10', a CPU chip 20' and a north bridge chip 30' arranged on the PCB 10'. Four securing holes 11' are defined in the PCB 10' around the CPU chip 20'. Four corners of the north bridge chip 30' are designated with N1', N2', N3', and N4'. A software LS-DYNA is used for simulating stress distribution on the tin balls at the corners of the north bridge chips in FIG. 1 when the PCB 10' with heat dissipating modules mounted thereon suffer an impact. Simulation conditions are set as follows: the initial velocity of the PCB 10' is 4.86 meters/second when the PCBs 10' suffer an impact, and a maximal acceleration of four corners of the PCBs 10' is determined to be 45 gravities. The stresses on the corners of the north bridge chip 30' in the FIG. 1 during an impact are detailed in a table below:

| Corner | Stress in megapascals (MPa) |
|---|---|
| N1' | 205.3 |
| N2' | 99.27 |
| N3' | 94.3 |
| N4' | 149.7 |

As can be seen in the above table, the corner N1' of the north bridge chip 30' in the conventional motherboard nearest to the heat dissipating module of the CPU chip 20' suffers a great deal more stress than others, and the lowest corner N4' suffers the second most stress, which may exceed the maximum, stress value the tin balls can undergo. Therefore, the tin balls located at these corners are easily damaged by impact to the PCB 10'.

What is needed, therefore, is a new motherboard structure which provides good performance of a semiconductor chip in a circuit board even after the circuit board suffers an impact.

SUMMARY

A motherboard includes a printed circuit board, a first chip and a second chip arranged on the printed circuit board in parallel. A plurality of securing holes are defined in the printed circuit board around the first chip. At least one isolating hole is defined in the printed circuit board between the second chip and a first line determined by two of the securing holes close to the second chip. Should the printed circuit board suffer from an impact, damage to the chips may be effectively minimized or prevented.

Other advantages and novel features of the present invention will become more apparent from the following detailed description of preferred embodiment when taken in conjunction with the accompanying drawings, in which:

DETAILED DESCRIPTION OF THE EMBODIMENTS

Figure 2:
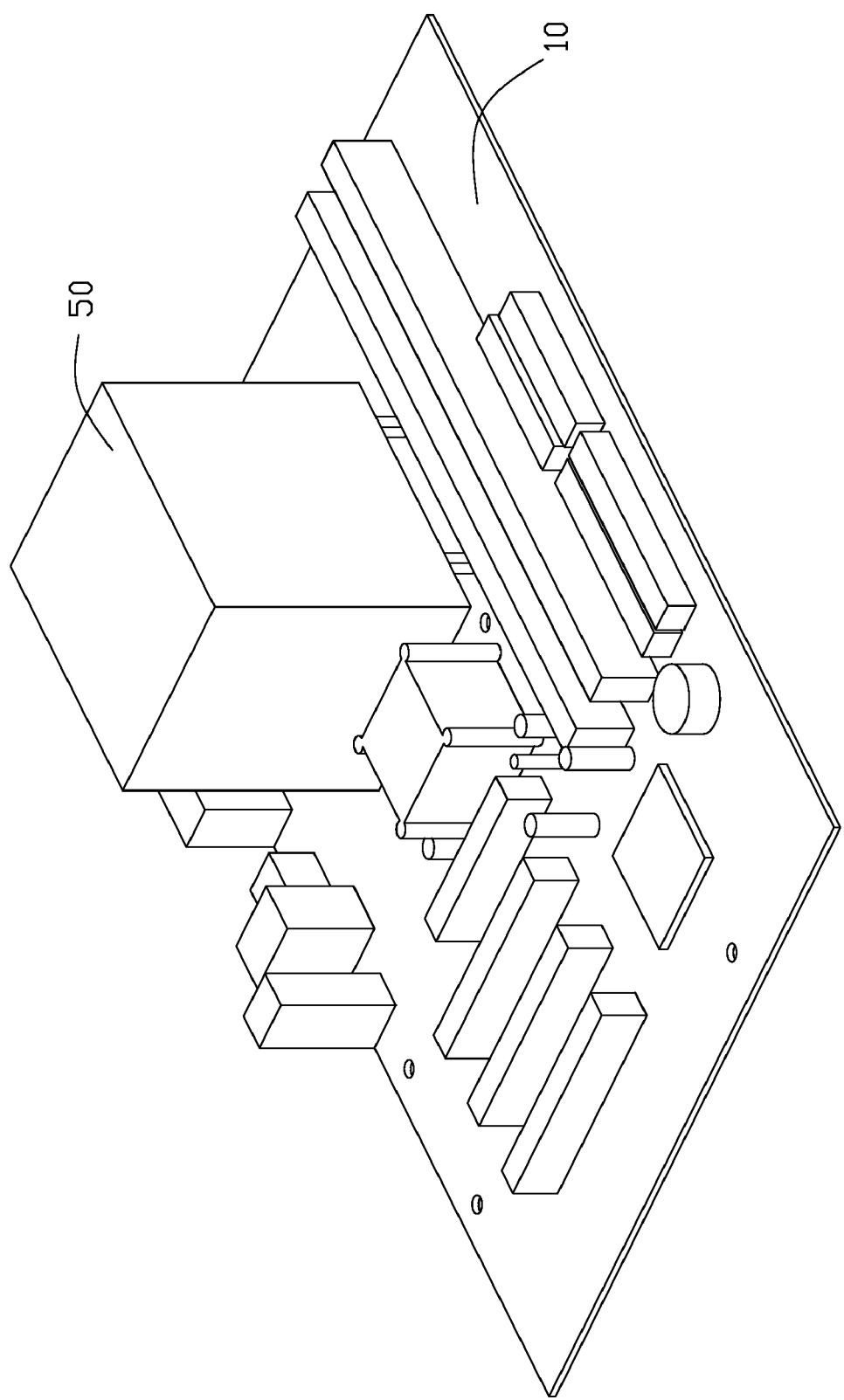
FIG. 2 is an isometric, perspective assembled view of a motherboard in accordance with an embodiment of the present invention, with a heat dissipating module.
Figure 3:
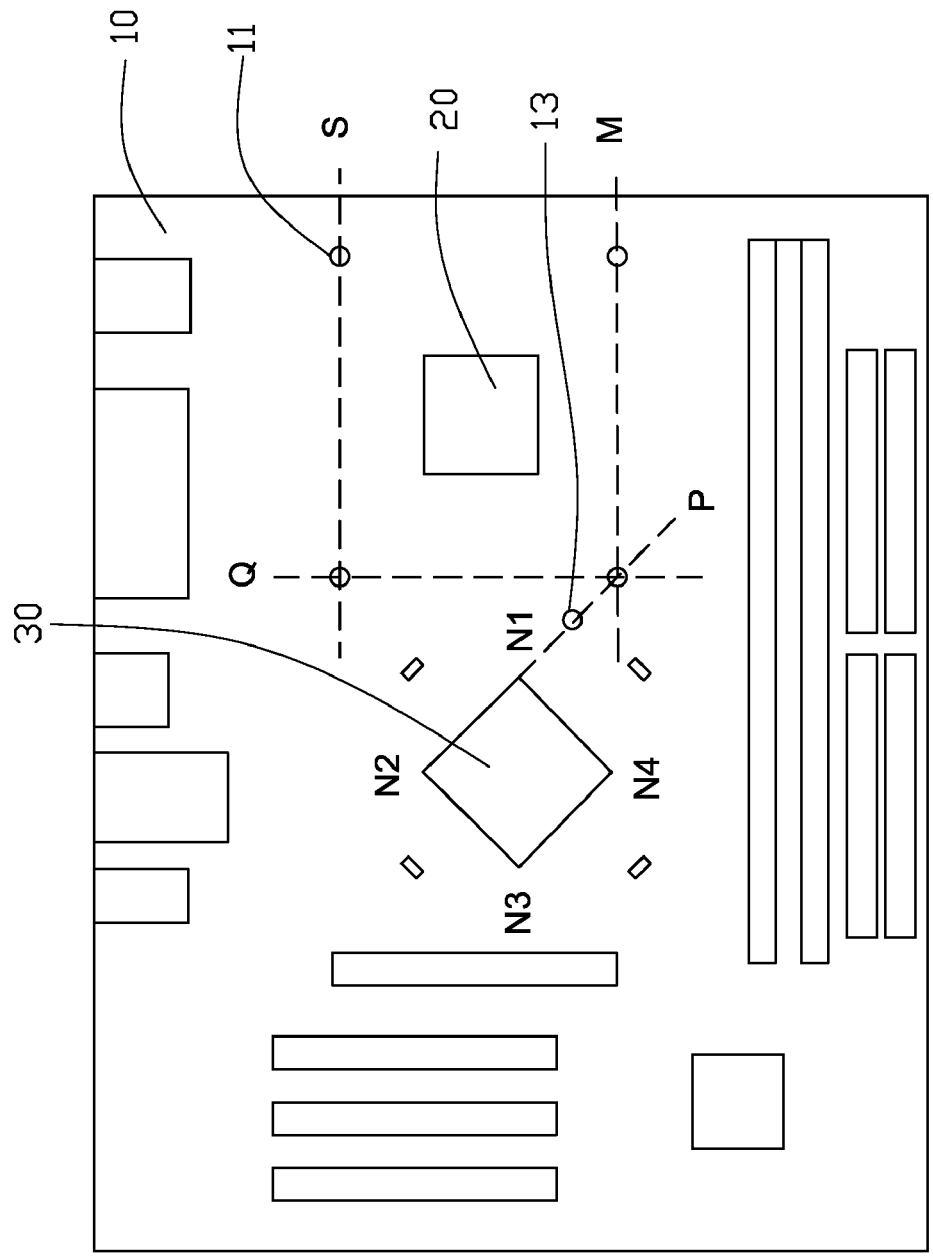
FIG. 3 is a plan view of the motherboard of FIG. 2.

Referring to FIGS. 2 and 3, a motherboard according to a first embodiment of the present invention includes a printed circuit board (PCB) 10, a first chip, such as a central processing unit (CPU) 20, and a second chip, such as a north bridge chip 30, arranged on the PCB 10 in parallel. The CPU 20 and north bridge chip 30 are respectively jointed to the PCB 10 via a plurality of tin balls. Four securing holes 11 are defined in the PCB 10 around the CPU 20, for securing a heat dissipating module 50 on the CPU 20. A line S determined by two adjacent securing holes 11 is parallel to a line M determined by the other two adjacent securing holes 11. The CPU 20 is square or rectangular, and centrally located in a square or rectangular area determined by the four securing holes 11. The north bridge chip 30 is also square or rectangular, including four corners N1, N2, N3, and N4. A line determined by two opposite corners N1 and N3 of the north chip 30 is located between the parallel lines S and M, and is substantially parallel to the lines S and M but closer to the line M. An isolating hole 13 is defined in a line P in the PCB 10 which is determined by the corner N1 nearest to the CPU 20 and the securing hole 11 nearest to the corner N1, for preventing stress on the PCB 10 generated by the heat dissipating module 50 being transmitted to the north bridge chip 30, thereby reducing stress applied on the tin balls of the north bridge chip 30.

The software LS-DYNA is then used for simulating stress distribution on the tin balls at the corners of the north bridge chips in FIG. 3 when the PCB 10 with heat dissipating modules mounted thereon suffer an impact. Simulation conditions of the PCB 10 of FIG. 3 are the same as that of the PCB 10' of FIG. 1: e.g. the initial velocity of the PCB 10 is 4.86 meters/second when the PCBs 10 suffer an impact, and a maximal acceleration of four corners of the PCB 10, is determined to be 45 gravities. The stresses on the corners of the north bridge chip 30 FIG. 3 during an impact are detailed in a table below:

| Corner | Stress in megapascals (MPa) |
|---|---|
| N1 | 181.4 |
| N2 | 96.7 |
| N3 | 91.9 |
| N4 | 147.1 |

Figure 1:
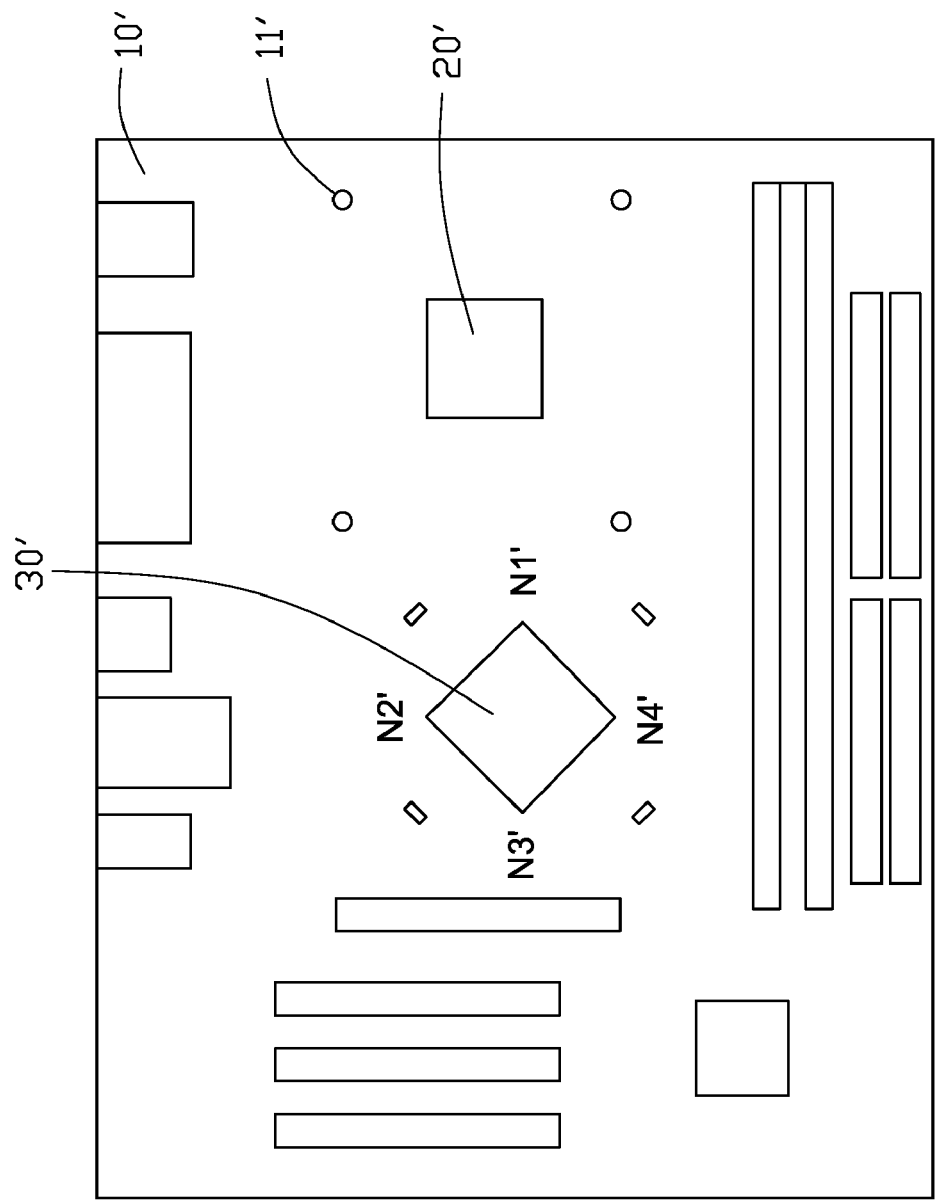
FIG. 1 is a plan view of a conventional motherboard.

According to the above table, the four corners of the new motherboard as shown in FIG. 3 with an isolating hole 13 defined in the line P, suffers lower stress than the corresponding corners in the conventional motherboard shown in FIG. 1, especially the corner N1 nearest to the heat dissipating module 50, which suffers 11.64% less stress than the corresponding corner N1' of the north bridge chip 30' in the conventional motherboard.

Figure 4:
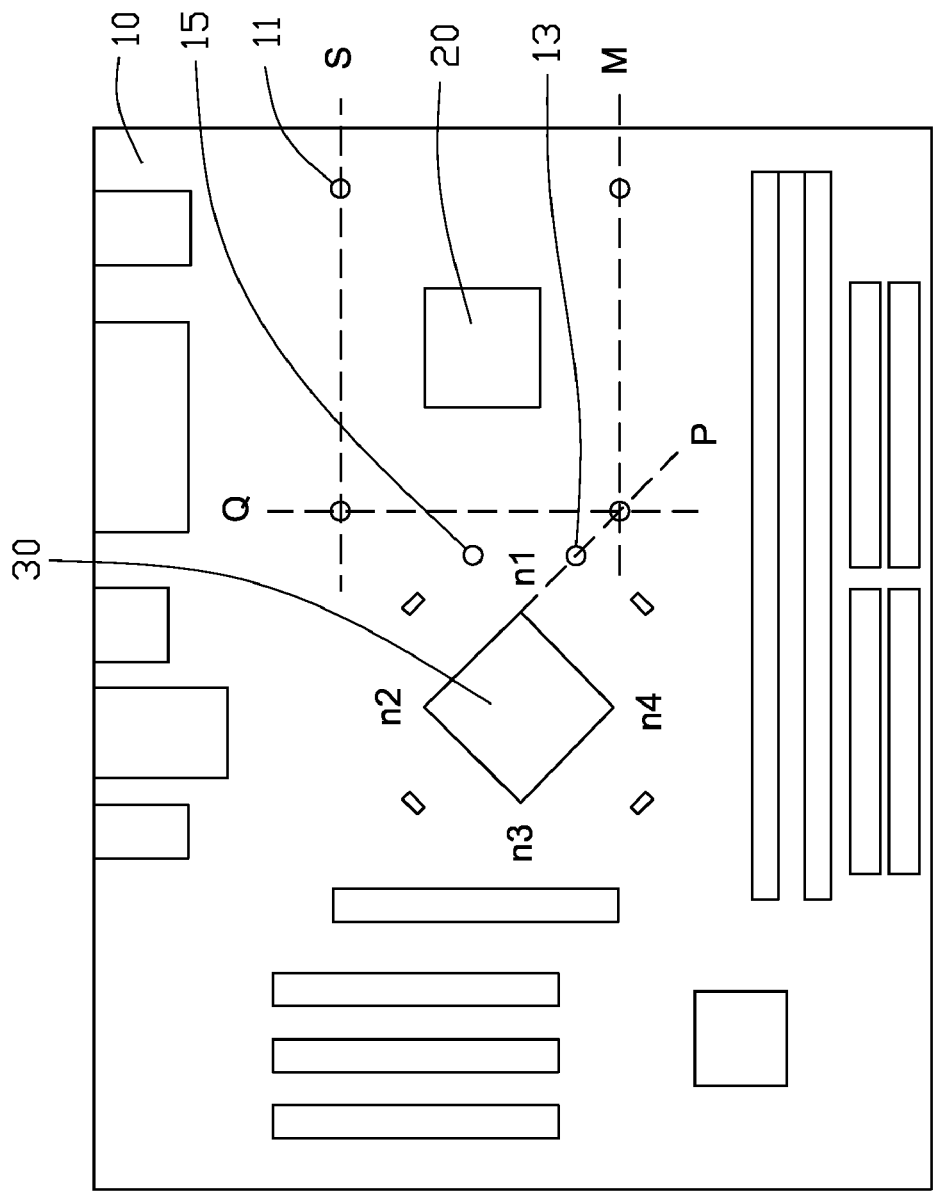
FIG. 4 is a plan view of the motherboard in accordance with a second embodiment of the present invention.

Referring also to FIG. 4, a second embodiment of the present invention is shown. The motherboard in the second embodiment is based on the aforesaid embodiment shown in FIG. 3. Four corners of the north bridge chip 30 in FIG. 4 corresponding to those in FIG. 3 are named as n1, n2, n3, and n4. Another isolating hole 15 is defined in the printed circuit board 10 between the corner n1 of the north bridge chip 30 close to the CPU chip 20 and a line Q determined by two adjacent securing holes 11 close to the north bridge chip 30. The isolating hole 15 may also be located in another place of the printed circuit board 10 between the north bridge chip 30 and the CPU chip 20. The line Q is located between the CPU chip 20 and the north bridge chip 30, and is perpendicular to the lines S and M. The stress on the corners of the north bridge chip 30 in FIG. 4 during an impact is detailed in a table below:

| Corner | Stress in megapascals (MPa) |
| --- | --- |
| n1 | 176.4 |
| n2 | 91.5 |
| n3 | 90.3 |
| n4 | 145.6 |

As can be seen in the above table, the four corners of the new motherboard as shown in FIG. 4 suffer lower stress than the corresponding corners in the conventional motherboard shown in FIG. 1, especially the corner n1 nearest to the heat dissipating module 50, which suffers 14.07% less stress than the corresponding corner N1' of the north bridge chip 30' in the conventional motherboard. Therefore, should the PCB 10 suffer an impact, chances that the tin balls between the north bridge chips and the PCB 10 will suffer damage are minimized or possibly eliminated with the present embodiments.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A motherboard comprising:
   a printed circuit board defining a plurality of securing holes; and
   a first chip and a second chip arranged on the printed circuit board;
   wherein the plurality of securing holes defined in the printed circuit board surround the first chip, for securing a heat dissipating module on the first chip by fasteners; the plurality of securing holes comprises a first securing hole and a second securing hole located between the first chip and the second chip; a first line is defined by the first securing hole and the second securing hole;
   the printed circuit board comprises at least one isolating hole located in a second line, determined by one corner of the second chip closest to the first chip and the first securing hole, and the isolating hole is located between the one corner and the first securing hole; and
   a first diagonal line, determined by a first pair of diagonally opposed corners of the second chip, is perpendicular to the first line, and a second diagonal line, determined by a second pair of diagonally opposed corners of the second chip, is parallel to the first line; and
   wherein the plurality of securing holes comprise four securing holes arranged in a rectangular shape, the four securing holes comprise the first securing hole, the second securing hole, a third securing hole, and a fourth securing hole, the first securing hole and the third securing hole determine a third line perpendicular to the first line, and the second securing hole and the fourth securing hole determine a fourth line parallel to the third line.

2. The motherboard as described in claim 1, wherein the first chip is a CPU chip.

3. The motherboard as described in claim 1, wherein the second chip is a north bridge chip.

4. The motherboard assembly as described in claim 1, wherein the first line is positioned at an oblique angle relative to the second line.

5. The motherboard assembly as described in claim 1, wherein the second chip comprises a side edge connected to the one corner, and the side edge aligned with the second line.

6. A motherboard assembly comprising:
   a first rectangular chip;
   a heat dissipating module disposed on the first rectangular chip; a printed circuit board with the first rectangular chip mounted thereon, the primed circuit board defining a plurality of securing holes engaged with the heat dissipating module by fasteners, the plurality of securing holes arranged in a rectangular shape; and
   a second rectangular chip mounted on the primed circuit board; wherein the plurality of securing holes includes a first securing hole located between the first rectangular chip and the second rectangular chip, the second rectangular chip having a corner nearest the first securing hole, and the primed circuit board comprises a first isolating hole defined therein between the corner and the first securing hole; and the second rectangular chip is positioned at an oblique angle relative to the first rectangular chip; and the corner, the first isolating hole, and the first securing hole, are located on a common straight line;
   wherein the plurality of securing holes comprises a second securing hole located between the first rectangular chip and the second rectangular chip; a first line is determined by the first securing hole and the second securing hole; and a first diagonal line determined by a first pair of diagonally opposed corners of the second chip is perpendicular to the first line.

7. The motherboard assembly as described in claim 6, wherein a second diagonal line determined by a second pair of diagonally opposed corners of the second chip is parallel to the first line.

8. The motherboard assembly as described in claim 6, wherein the plurality of securing holes further comprises a third securing hole and a fourth hole, the first securing hole and the third securing hole determine a second line perpendicular to the first line, and the second securing hole and the fourth securing hole determine a third line parallel to the third line.

9. The motherboard assembly as described in claim 6, wherein the first line is positioned at an oblique angle relative to the common straight line.

10. The motherboard assembly as described in claim 6, wherein the second rectangular chip comprises a side edge connected to the corner, and the side edge aligned with the common straight line.

* * * * *